US012754713B2

(12) United States Patent
Chao et al.

(10) Patent No.: US 12,754,713 B2
(45) Date of Patent: Oct. 6, 2026

(54) BINARY-WEIGHTED CAPACITOR CHARGE-SHARING FOR MULTIPLICATION

(71) Applicant: Intel Corporation, Santa Clara, CA (US)

(72) Inventors: Yu-Lin Chao, Portland, OR (US); Clifford Lu Ong, Portland, OR (US); Dmitri E. Nikonov, Beaverton, OR (US); Ian A. Young, Portland, OR (US); Eric A. Karl, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 980 days.

(21) Appl. No.: 17/730,011

(22) Filed: Apr. 26, 2022

(65) Prior Publication Data

US 2022/0253285 A1 Aug. 11, 2022

(51) Int. Cl.

| | |
|---|---|
| ***G06F 7/544*** | (2006.01) |
| ***G06F 7/50*** | (2006.01) |
| ***G06F 7/523*** | (2006.01) |
| ***H03M 1/22*** | (2006.01) |

(52) U.S. Cl.
CPC .............. *G06F 7/5443* (2013.01); *G06F 7/50* (2013.01); *G06F 7/523* (2013.01); *H03M 1/22* (2013.01)

(58) Field of Classification Search
CPC ......... G06F 7/50; G06F 7/5443; G06N 3/065; H03M 1/12
See application file for complete search history.

(56) References Cited

U.S. PATENT DOCUMENTS 11,056,178 B1 * 7/2021 Bedeschi .............. G11C 11/221
11,714,749 B2 * 8/2023 Lee ....................... G11C 11/412 365/189.011
12,487,795 B2 * 12/2025 Yang ..................... G06F 7/5443
(Continued)

OTHER PUBLICATIONS

Su, J., et al., "A 28nm 384kb 6T-SRAM Computation-in-Memory Macro with 8b Precision for AI Edge Chips," IEEE International Solid-State Circuits Conference/Session 16/Computation in Memory/ 16.3; 3 pages (Feb. 17, 2021).
(Continued)

*Primary Examiner* — James Trujillo
*Assistant Examiner* — Maria De Jesus Rivera
(74) *Attorney, Agent, or Firm* — Akona IP PC

(57) ABSTRACT

An analog multiplication circuit includes switched capacitors to multiply digital operands in an analog representation and output a digital result with an analog-to-digital convertor. The capacitors are arranged with a capacitance according to the respective value of the digital bit inputs. To perform the multiplication, the capacitors are selectively charged according to the first operand of the multiplication. The capacitors are then connected to a common interconnect for charge sharing across the capacitors, averaging the charge according to the charge determined by the first operand. The capacitor are then maintained or discharged according to a second operand, such that the remaining charge represents a number of "copies" of the averaged charge. The capacitors are then averaged and output for conversion by an analog-to-digital convertor. This circuit may be repeated to construct a multiply-and-accumulate circuit by combining charges from several such multiplication circuits.

20 Claims, 13 Drawing Sheets

(56) References Cited

U.S. PATENT DOCUMENTS

| | | | | |
|---|---|---|---|---|
| 12,554,976 | B2 * | 2/2026 | Atallah | G06N 3/065 |
| 2019/0042199 | A1 * | 2/2019 | Sumbul | G11C 8/10 |
| 2022/0012016 | A1 * | 1/2022 | Wang | G06F 7/5443 |
| 2022/0075596 | A1 * | 3/2022 | Agrawal | H03K 19/20 |
| 2022/0366059 | A1 * | 11/2022 | Sasidharan Rajalekshmi | G11C 11/4094 |

OTHER PUBLICATIONS

Yin, S., et al., "PIMCA: A 3.4-Mb Programmable In-Memory Computing Accelerator in 28nm for On-Chip DNN Inference," Symposium on VLSI Circuits Digest of Technical Papers; 2 pages (2021).

* cited by examiner

BINARY-WEIGHTED CAPACITOR CHARGE-SHARING FOR MULTIPLICATION

TECHNICAL FIELD

This disclosure relates generally to analog multiplication computation and particularly to analog computation of multiply-and-accumulate operations that may be performed in-memory.

BACKGROUND

This disclosure describes energy-efficient hardware to execute multiplication operations and particularly vector matrix multiplication (VMM) operations for digital data (e.g., values represented in logical bits or Boolean values). A VMM operation is a fundamental operation for many neural networks, and includes summing the results of a several multiplication operations. VMM operations may also be referred to as a "multiply and accumulate" (MAC) operation. In many neural networks, a convolution layer is defined by the multiplication of a set of activations with a respective set of weights, which are then summed to yield the output for a particular channel. For example, a set of activations $A=\{A_0-A_n\}$ are multiplied by a respective set of weights $W=\{W_0-W_n\}$ to yield an output O: $O=(A_0\times W_0)+(A_1\times W_1)+ \ldots +(A_n\times W_n)$. As such, efficiently calculating multiplications and the sum thereof in hardware may significantly improve neural network hardware efficiency and effectiveness.

Prior accelerators may typically require extensive data transfer or several clock cycles for processing these operations in the logical domain, while prior analog solutions may be difficult to successfully realize with sufficient accuracy. There is thus a need for an approach that improves energy consumption, hardware footprint, maintains accuracy, and may operate on logical (e.g., Boolean) inputs, such as those from a memory storage.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Overview

Figure 1:
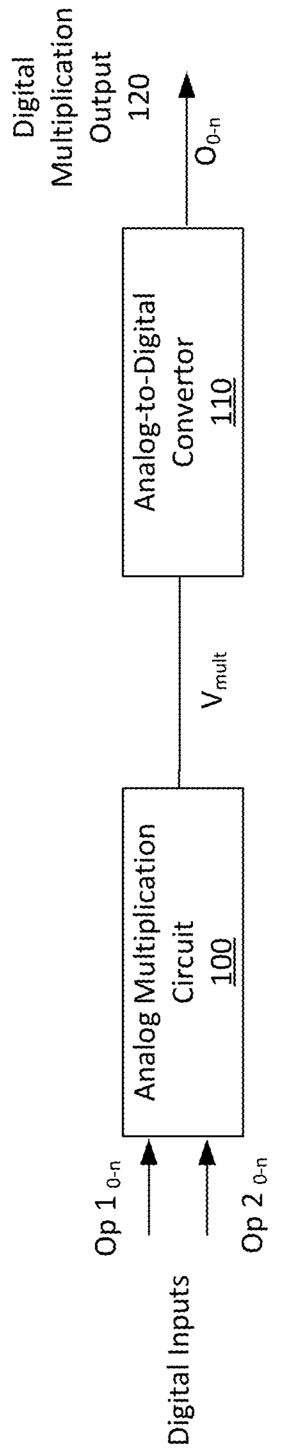
FIG. 1 is an example arrangement for analog multiplication of digital inputs, according to one embodiment.

The systems, methods, and devices of this disclosure each have several innovative aspects, no single one of which is solely responsible for all desirable attributes disclosed herein. Details of one or more implementations of the subject matter described in this specification are set forth in the description below and the accompanying drawings.

This disclosure below provides an improved method for performing multiplication operations and particularly for performing multiple such operations in parallel with subsequent summation to implement a VMM/MAC operation. Input operands for the multiplication may be input in the digital domain (e.g., as Boolean, digital bits), and processed by the circuit in the analog domain without a prior conversion by a digital-to-analog converter (DAC) and without the need to store or write intermediate values to memory. Switched capacitors and their coupling with SRAM provide one effective implementation for this circuit for compute-in-memory solutions.

A circuit to perform the multiplication may include a plurality of capacitors that correspond to digital bit values, such that the comparative charge of each capacitor for a given voltage corresponds to the relative value of the bit values. For example, the capacitance of the respective capacitors may be one, two, four, and eight for a four-bit logical value. The charging and discharging of the capacitors is controlled by a set of first switches to selectively charge and discharge the capacitors according to the respective multiplication operands. A second switch may also be included to connect the common interconnect to a charging voltage, ground, or an output.

To perform the multiplication, the capacitors may be charged according to a first operand (e.g., a weight value) by connecting the respective capacitors to a positive voltage or a ground by the first switch, and the second switch connected to the charging voltage. After charging, the capacitors may be connected to a common interconnect with the first switch, and the second switch disconnected from the charging voltage, such that the charge of the charged capacitors is shared among all of the capacitors, averaging the charge to a level based on the respective capacitance of the charged capacitors. This stores an averaged charge in the capacitors that reflects the value of the first operand. Next to "multiply" by the second operand (e.g., an activation value), the capacitors are either connected to ground or remain connected to the common interconnect with the first switches based on the second operand, removing the charge for the capacitors which have a logical zero in respective bits of the second operand. To output a voltage reflecting the multiplication, the capacitors are switched to the common interconnect by the first switches, and the charge is again averaged among the capacitors to yield a voltage level reflecting the multiplication. An analog-to-digital convertor may then interpret the voltage level and output a digital multiplication output.

To implement a VMM/MAC operation, a plurality of analog multiplication circuits may be implemented in parallel and charge and selectively discharge according to respective operands within a local common interconnect. To "accumulate" the results of the multiplication, the local common interconnects of each multiplication circuit are connected, permitting the capacitor charge to average across the capacitors disposed at each multiplication circuit and output a voltage reflecting the "sum" of the multiplications. This voltage is read by an analog-to-digital convertor and outputs a multiply-and-accumulate result.

In one embodiment, these circuits may be implemented within a memory array, permitting operand values to be read and operated on within the memory array. When implemented in a memory array, the MAC calculation may be highly parallelable and reduce the number of cycles required for a MAC operation.

As such, this approach for a MAC operation permits a direct feed-through of digital inputs, both weight and activation, and use of binary-weighted capacitors to provide multi-bit support while executing the MAC operation in the analog domain with minimized clock cycles. In addition, by direct adoption of digital inputs, a source of error from digital-to-analog conversion can be avoided.

For purposes of explanation, specific numbers, materials, and configurations are set forth in order to provide a thorough understanding of the illustrative implementations. However, it will be apparent to one skilled in the art that the present disclosure may be practiced without the specific details or/and that the present disclosure may be practiced with only some of the described aspects. In other instances, well known features are omitted or simplified in order not to obscure the illustrative implementations.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. The meaning of "a," "an," and "the" include plural references. The meaning of "in" includes "in" and "on."

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. The terms "substantially," "close," "approximately," "near," and "about," generally refer to being within +/−20% of a target value. Unless otherwise specified, the use of the ordinal adjectives "first," "second," and "third," etc., to describe a common object merely indicate that different instances of like objects are being referred to, and are not intended to imply that the objects so described must be in a given sequence, either temporally, spatially, in ranking or in any other manner.

In the following detailed description, various aspects of the illustrative implementations will be described using terms commonly employed by those skilled in the art to convey the substance of their work to others skilled in the art.

Analog Multiplication Circuit

FIG. 1 is an example arrangement for analog multiplication of digital inputs, according to one embodiment. In the example of FIG. 1, two digital inputs, operand 1 and operand 2, are input to an analog multiplication circuit 100, which generates a multiplication voltage $V_{mult}$ for conversion by an analog-to-digital convertor ("ADC") 110 to a digital multiplication output 120. In this example, two values (operand 1 and 2) are multiplied together with the analog multiplication circuit 100; in further examples discussed below, multiple similar circuits may be combined to perform a multiply-and-accumulate operation by performing multiplication with parallel analog multiplication circuits and accumulation is performed by combining voltages before an analog-to-digital convertor (ADC). Further examples are discussed with respect to FIGS. 4-5.

As shown in FIG. 1, the input operands of the analog multiplication circuit 100 may include digital bits 0-*n*, each typically representing individual base-2 bit values (e.g., four bits each representing a value of one, two, four, and eight). Within the analog multiplication circuit 100, the bit values are used to charge or discharge a set of capacitors and generate a voltage in $V_{mult}$ representing the result of the multiplication of the operands. $V_{mult}$ is interpreted by the ADC 110 to generate the respective logical (e.g., Boolean) representation as the digital multiplication output 120 as a set of output bits $O_{0-n}$. As further discussed below, the hardware shown in FIG. 1 may be incorporated within a memory array, for example a SRAM array, such that one or more of the operands (e.g., operand 1 or operand 2) is output from an SRAM memory cell and the digital multiplication output 120 may likewise be stored to a memory cell or array. As such, the analog multiplication circuit 100 and ADC 110 may be used to perform computation within a memory array in some embodiments.

Figure 2:
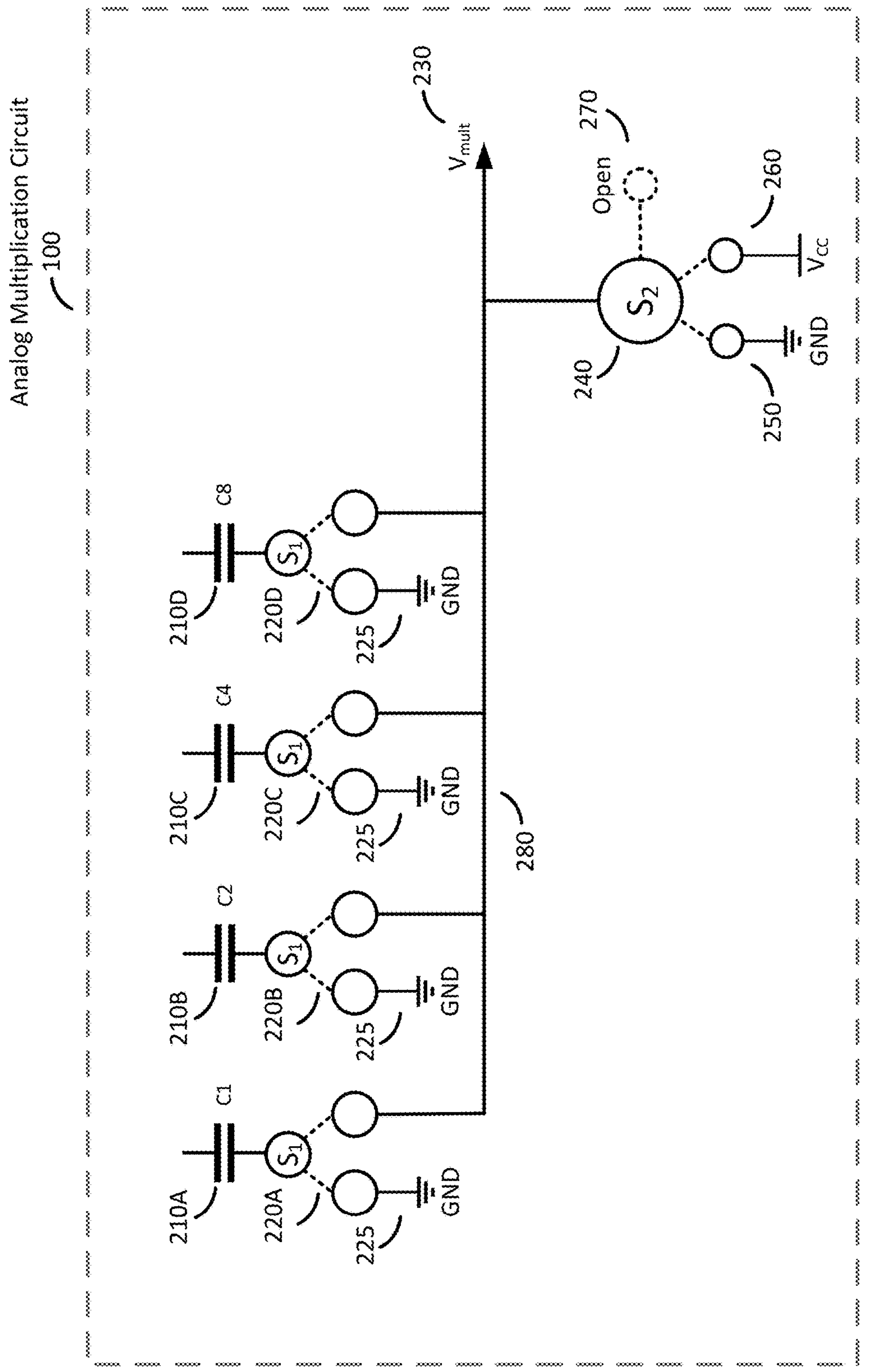
FIG. 2 illustrates an example analog multiplication circuit that supports a 4-bit operation, according to one embodiment.

FIG. 2 illustrates an example analog multiplication circuit 100 that supports a 4-bit operation, according to one embodiment. As shown in FIG. 2, the analog multiplication circuit includes a plurality of capacitors 210A-D along with respective first switches 220A-D ($S_1$). Each capacitor has a respective capacitance that corresponds to the value of an associated logical input bit. For example, the first capacitor 210A has a capacitance of C1 for the first input bit having a value of 1, while the fourth capacitor 210D has a capacitance of C8 for the fourth input bit having a value of 8. Though shown as individual capacitors in FIG. 2, in practice individual capacitors may be provisioned to yield the total capacitance for each respective input bit value. For example, capacitor 210B may be composed of two individual capacitors similar to capacitor 210A, capacitor 210C may be composed of four such capacitors, and capacitor 210D may be composed of eight such capacitors.

Each capacitor 210A-D is connected to a respective first switch 220A-D, which may be individually controlled to connect the respective capacitors to a ground voltage 225 or a common interconnect 280 connected to an output $V_{mult}$ 230. The first switches 220 may be controlled by a control circuit (not shown) that uses input operands and a sequence of steps/phases for controlling charging and discharging the capacitors 210. A second switch 240 may also be included for connecting the common interconnect to a ground voltage 250, a voltage source $V_{cc}$ 260, or may be disconnected from both set voltages and left open 270. As such, the 4-bit analog multiplication circuit is composed with total 15 units of capacitors arranged in four binary weighted branches with one switch for each branch to discharge or connect to a common interconnect. The particular arrangement of switches, ground, and charging/positive voltage may also be varied in additional embodiments to provide similar functionality.

FIGS. 3A-3E illustrate activation of the analog multiplication circuit 100 to provide an output voltage $V_{mult}$ representing the multiplication of two input operands, according to one embodiment. As discussed in FIG. 1, the output voltage may be processed by the ADC to generate digital output values from $V_{mult}$.

Generally, FIGS. 3A-3E illustrate clearing/discharging the respective capacitor charges & voltages, charging the capacitors according to a first operand, averaging/sharing the charge of the capacitors via the interconnect, removing charges according to the second operand, and connecting to the interconnect and to again share the charges and output $V_{mult}$. Table 1 below indicates the positions of the first and second switches in one embodiment of this configuration:

TABLE 1

Figure 3A:
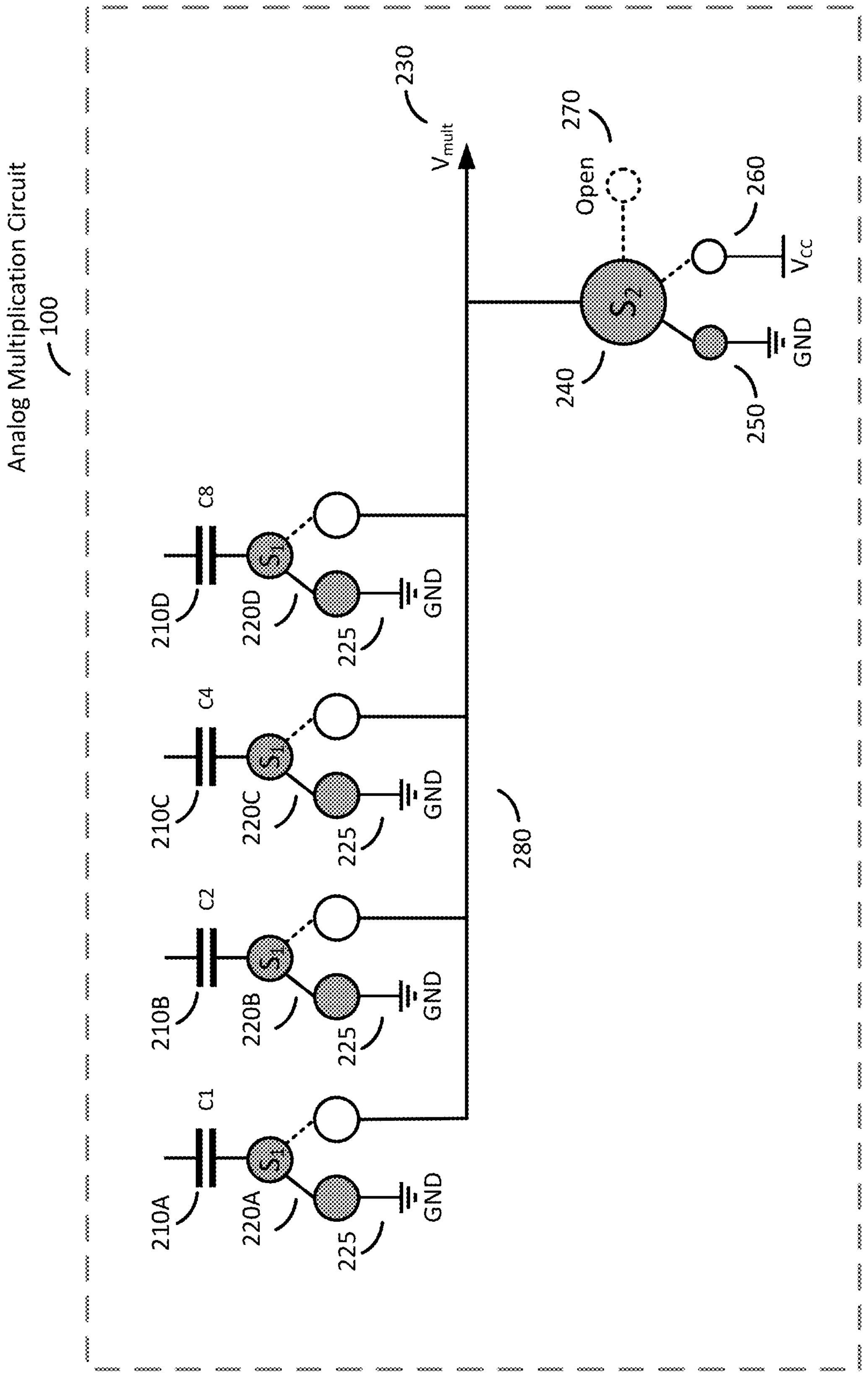
FIGS. 3A-3E illustrate activation of the analog multiplication circuit to provide an output voltage $V_{mult}$ representing the multiplication of two input operands, according to one embodiment.
Figure 3B:
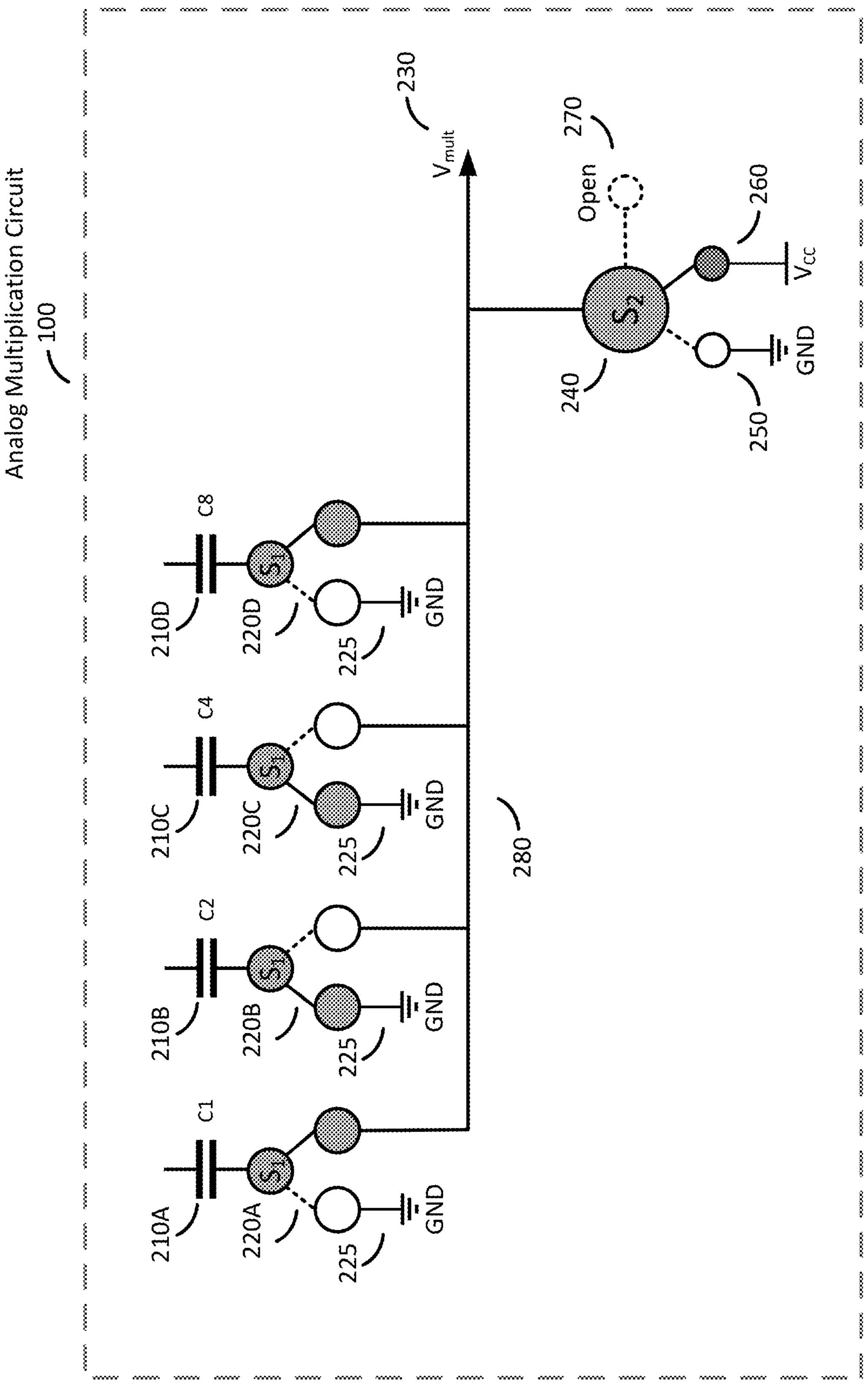
Figure 3C:
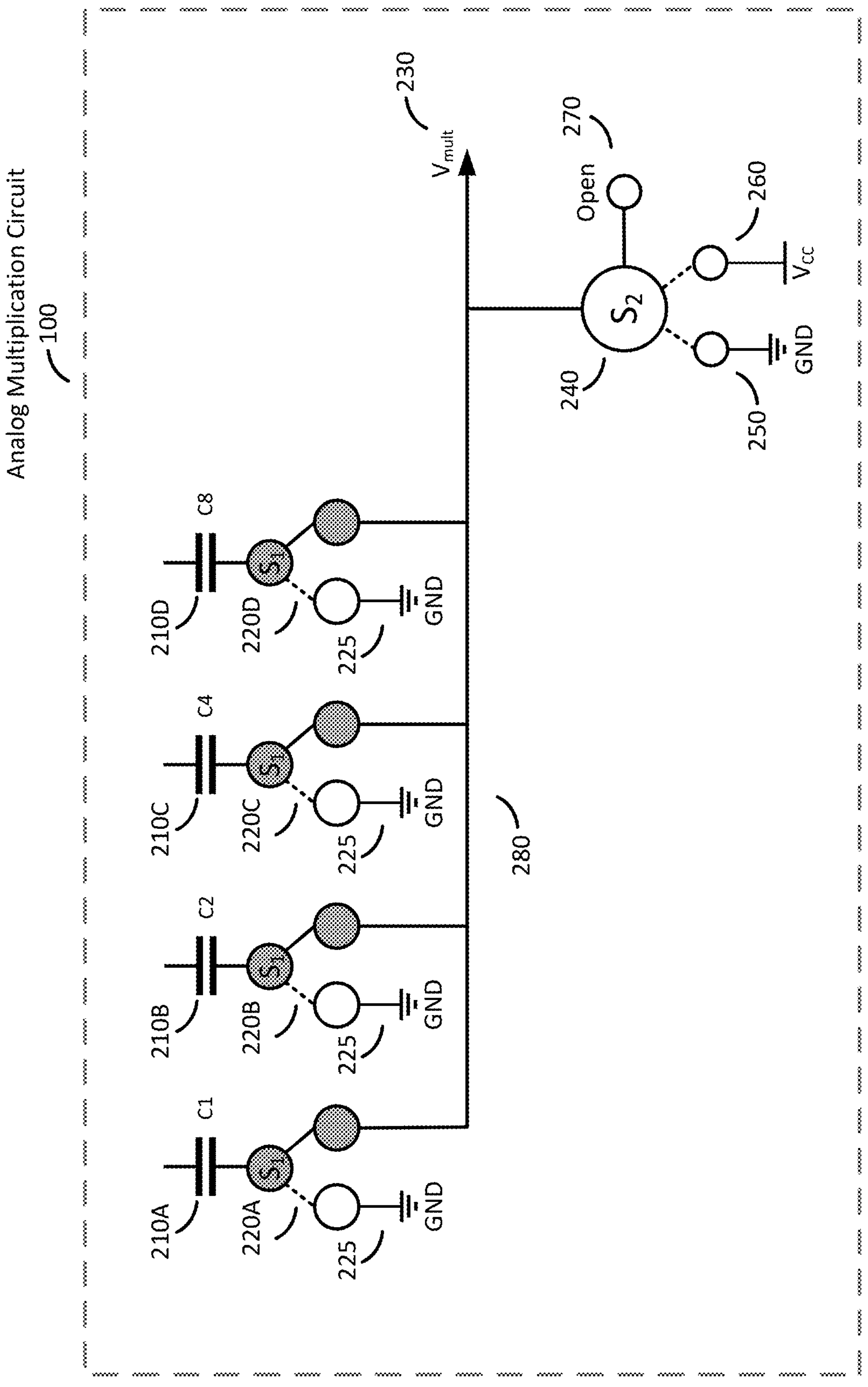
Figure 3D:
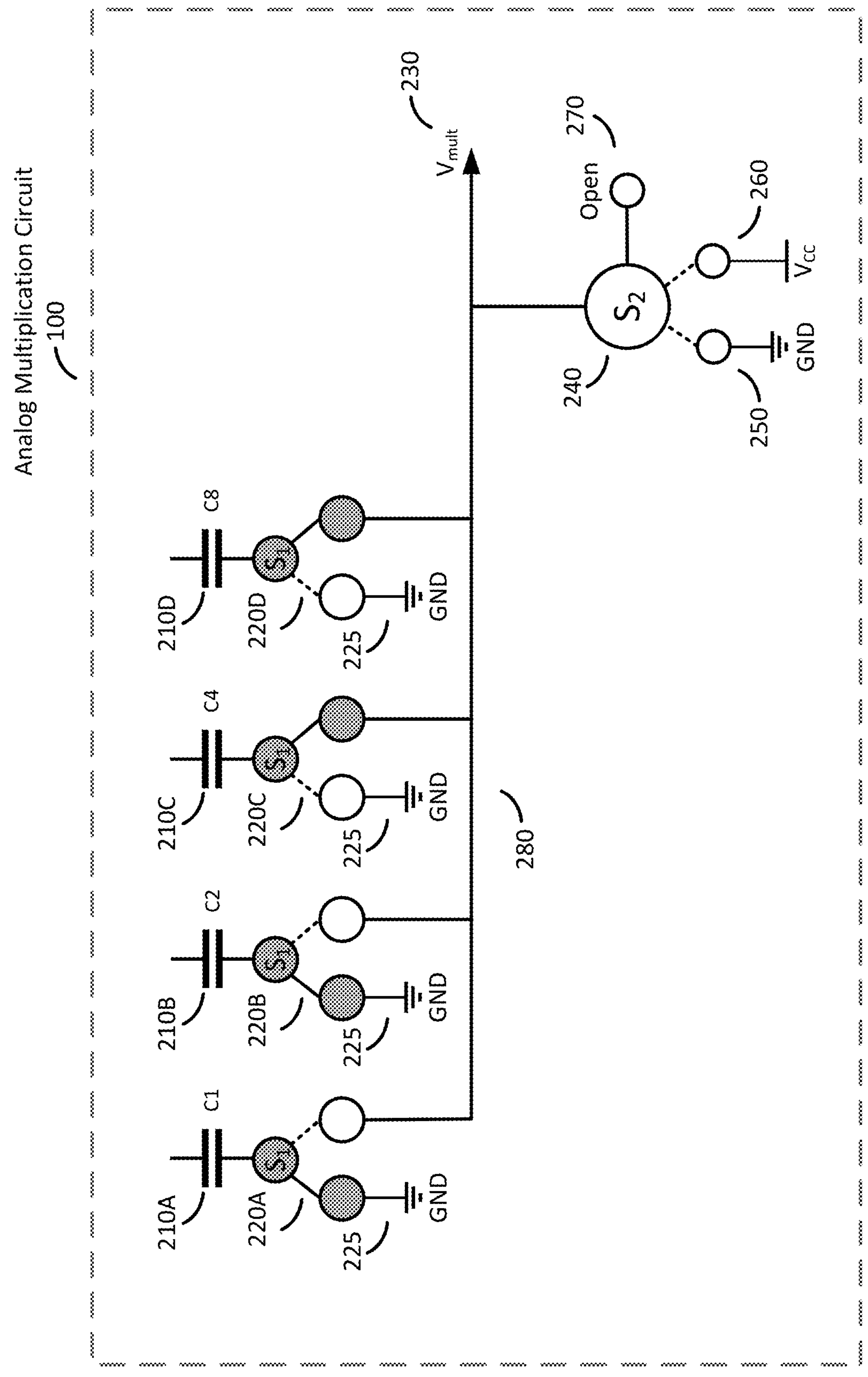
Figure 3E:
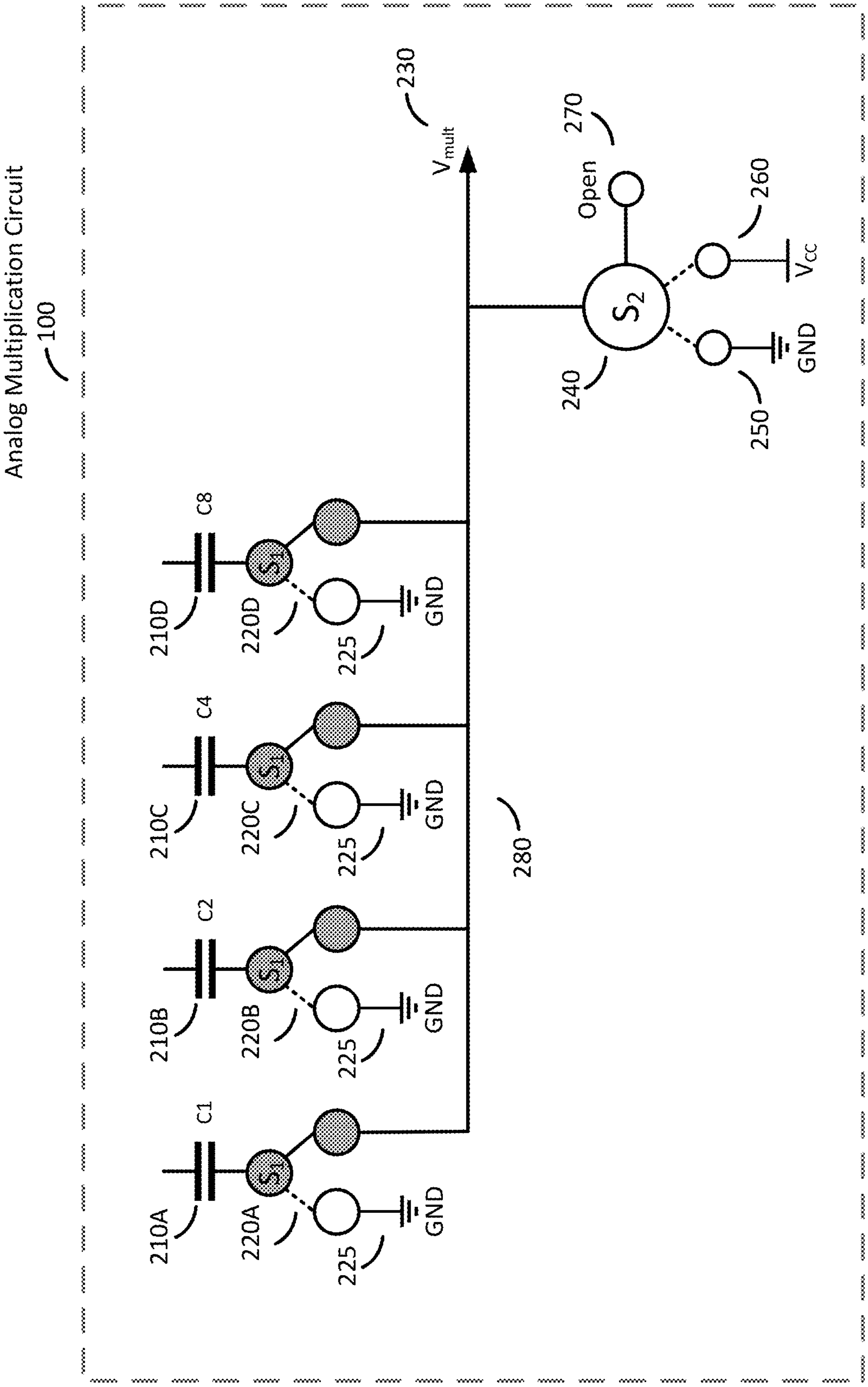

| Step/Figure | FIG. | S1 (Switch 220A-D) | S2 (Switch 240) |
|---|---|---|---|
| Discharge | FIG. 3A | GND | GND |
| Charge | FIG. 3B | First Operand | $V_{cc}$ |
| Average | FIG. 3C | Interconnect | Open |
| Discharge/ "Multiply" | FIG. 3D | Second Operand | Open |
| Output | FIG. 3E | Interconnect | Open |

FIG. 3A shows the discharge of the circuit by connecting the capacitors and interconnect to ground. As shown in FIG. 3A, each first switch 220 and second switch 240 are switched to a ground voltage 225, 250, to remove remaining charge.

Next, the capacitors 210 are charged based on the first operand by switching the first switches according to the bits of the first operand and connecting the common interconnect to a voltage source 260 with the second switch 240. This translates the first operand to a number of total charges stored in the capacitors 210 while the first operand remains represented in a digital form. In various embodiments, the first operand may represent a weight or an activation for a neural network convolutional layer. In the example of FIG. 3B, the first operand has a value of 1001, such that the first and fourth first switches 220A, 220D are connected to the common interconnect for charging, while the second and third first switches 220B, 220C, remain switched to the ground voltage 225. After this step, capacitor 210A and 210D are charged, yielding a total number of charges across the capacitors 210 of nine.

In the next step shown in FIG. 3C, the charges are shared across the plurality of capacitors and thus averaged, such that the value of the first operand is represented as a proportional charge on each capacitor 210. In this example, a total number of 9 charges is shared among the total capacitance of 15, such that each capacitor has a charge of 9/15. In this way, the total charges are then averaged out among the 15 units capacitors as a multiplier. To share the charge, the first switches 220 are connected to the common interconnect 280 and the second switch 240 is disconnected from an external source/drain (e.g., voltage source 260 and ground voltage 250) and may be left open 270.

To perform the multiplication, respective capacitors are maintained or discharged according to the second operand as shown in FIG. 3D. In this example, the second operand has a value of 1100, such that the first and second capacitors 210A, 210B are connected to a ground voltage 225 and the third and fourth capacitors 210C, 210D are maintained and connected to the common interconnect 280. In this way, a number of "copies" of the first operand are kept based on the second operand. In the example of FIG. 3D, twelve "copies" of the average charge (here, the average charge of 9/15) are kept by the capacitors. The remaining charge in the capacitors thus represents the product of multiplying the first and second operand.

As shown in FIG. 3E, the first switches 220 are connected to the common interconnect 280, so that the remaining charges may again average among the capacitors and the resulting $V_{mult}$ reflects a voltage of the multiplied inputs. In this case, the voltage is 12 "copies" of the averaged 9/15 charge, shared among 15 capacitors, yielding a voltage of $$\frac{9*12}{15^2}$$

the charging voltage $V_{cc}$ 260. To process the result, the ADC is configured to read $V_{mult}$ according to the output range of possible the multiplication products for the input operands (e.g., to interpret voltage levels from 0-$15^2$). In one embodiment, the output for $V_{mult}$ is scaled or otherwise mapped to an output range by the ADC. For example, the output may be the same value range as the input operands (e.g., when the input operands are represented in 4 bits, the output may be mapped to an output range of 4 bits by scaling or another transformation). In practice, many applications may operate effectively with such output scaling to a relatively small value range. For example, many neural networks may perform accurately with a relatively small value range (e.g., as represented by 2, 3, 4, 6, or 8 bits).

In this way, the analog multiplication circuit 100 may be used to effectively process digital inputs in the analog domain and output a digital multiplication result with effective use of the provisioned capacitors. The capacitors in this configuration are used to store a charge reflecting the value of the first operand, and then re-used to reflect the multiplication of that first operand with the second operand, permitting the provisioned capacitance (e.g., a number of unit capacitors) to match the logical value of the operands (e.g., 15 capacitors for a maximum operand value of 15 in a 4-bit representation).

To implement the circuit in memory, e.g., SRAM memory, the capacitors may be realized by traditional back-end-of-line metal-finger capacitor (MFC), state-of-art embedded DRAM-like capacitor, or a frontend-of-line-based capacitor. In one embodiment, the capacitor array may be highly integrated with the frontend transistors.

The first and second switches may be implemented with appropriate control circuitry to optimize the steps discussed above, e.g., discharging, charging, charge sharing, etc., as determined by the current phase/clock cycle and the values of the first operand and second operand. In one embodiment, the first switch may be configured as a two-way switch, such that the values of the first or second operand are selected by a multiplexor to connect or disconnect individual capacitor switches, and the charge/discharge status connection may also be selected by the current phase/clock cycle. As such, the switches may be controlled by an appropriate control circuit to execute the discussed functions.

Figure 4:
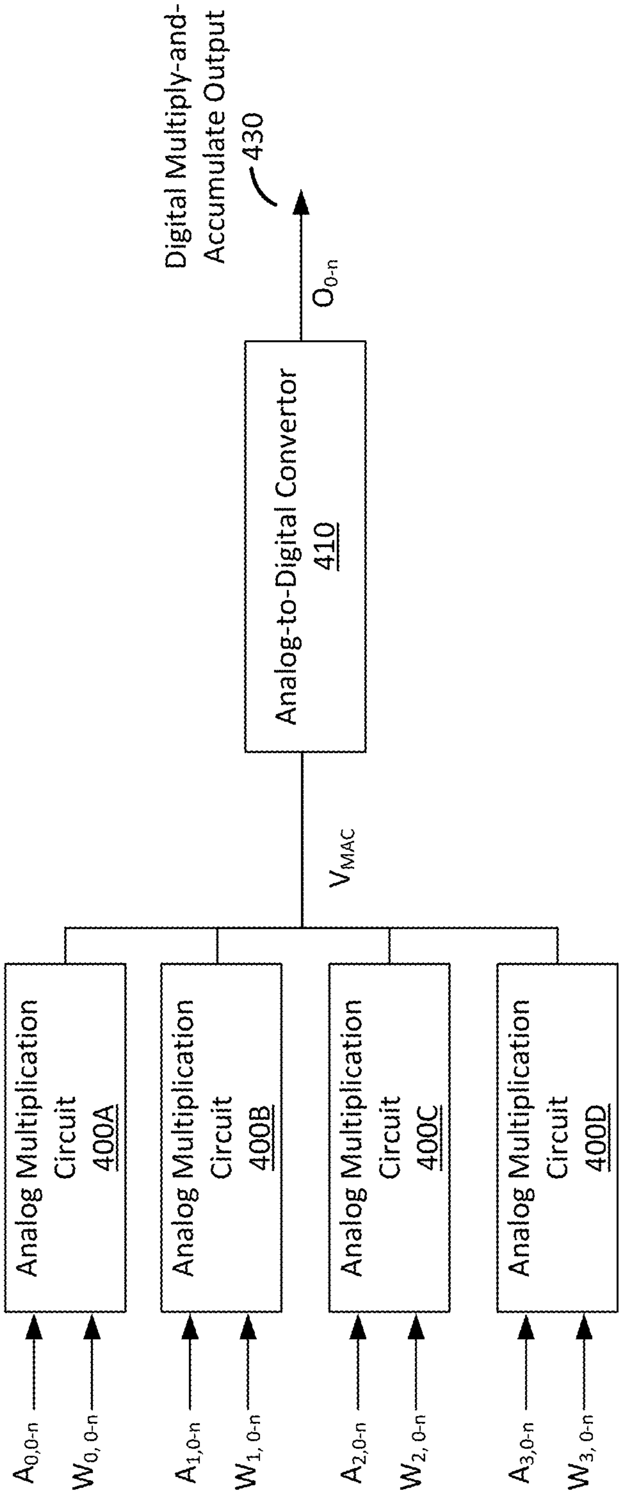
FIG. 4 shows an example arrangement for executing an MAC operation using a plurality of charge-sharing analog multiplication circuits, according to one embodiment.

FIG. 4 shows an example arrangement for executing a MAC operation using a plurality of charge-sharing analog multiplication circuits 400A-D, according to one embodiment. In this example, each analog multiplication circuit 400 receives a respective set of inputs, e.g., an activation A and a weight W, and generates the respective product as a partial sum represented by capacitor charges stored within the respective capacitors of each analog multiplication circuit 400. To generate the sum of the respective multiplications, the charge is shared across all of the analog multiplication circuits 400A-D to generate a voltage $V_{MAC}$ that combines the partial sums and represents the summed multiplications. To perform the partial products, each analog multiplication circuit 400A-D generates a local product by selectively charging, averaging, and selectively discharging locally within the analog multiplication circuit before averaging across the set of analog multiplication circuits 400A-D.

Figure 5:
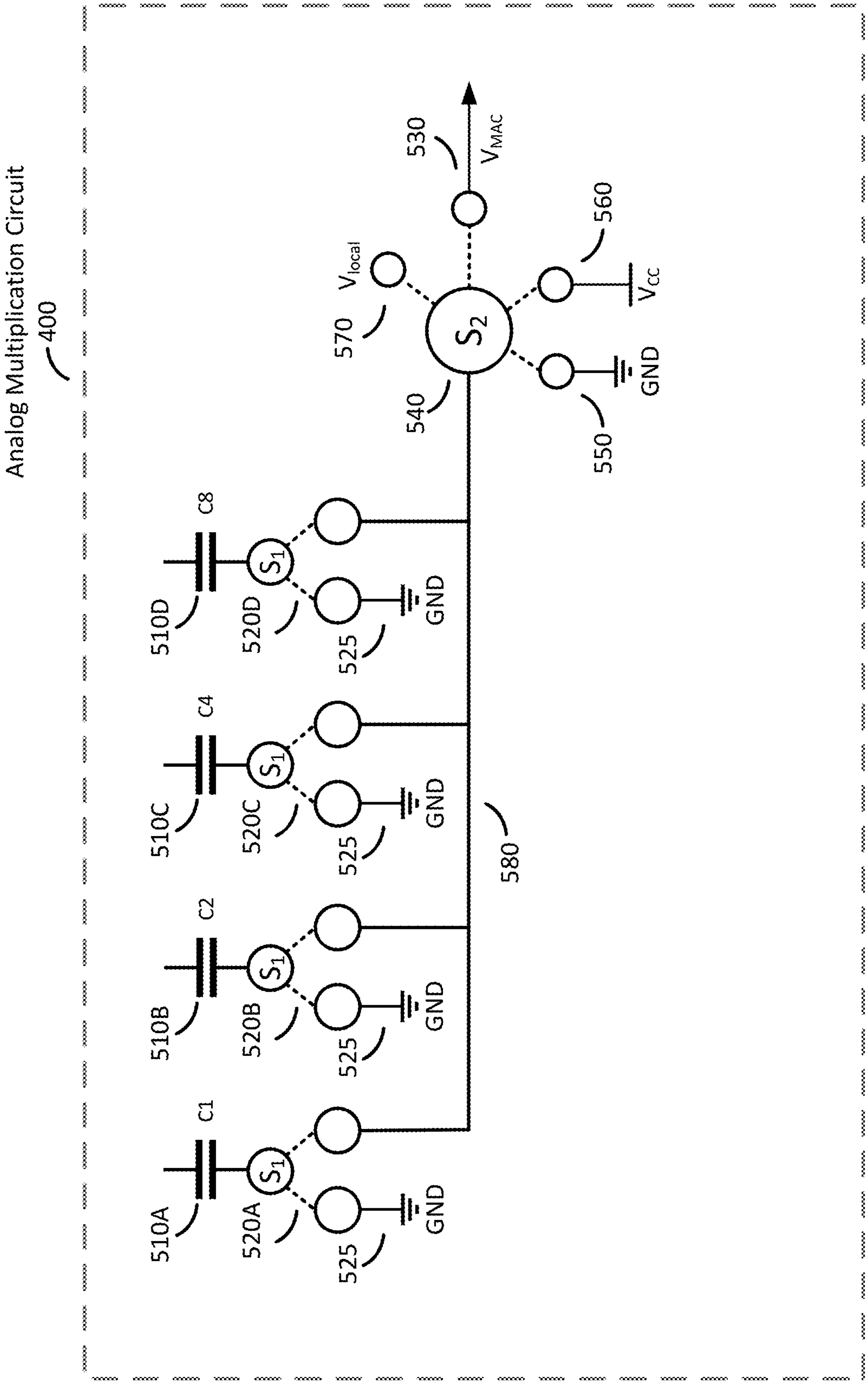
FIG. 5 shows an example analog multiplication circuit for local determination of a partial result, according to one embodiment.

FIG. 5 shows an example analog multiplication circuit for local determination of a partial result, according to one embodiment. The analog multiplication circuit 400 may be similar to the analog multiplication circuit 100 as shown in FIG. 2. For example, the analog multiplication circuit 400 includes capacitors 510A-D, associated first switches 520A-D for switching to a ground voltage 525 and interconnect 580. Similar to the example analog multiplication circuit 100, the analog multiplication circuit 400 may include a second switch 540 for connection to a ground voltage 550, and a charging voltage $V_{cc}$ 560. To permit the local averaging, the second switch 540 may be capable of disconnecting from the output to the ADC 410 (e.g., $V_{MAC}$ 530). Instead, after charging, the second switch may be disconnected from the output and left open, such that the charge may be manipulated locally at a local voltage $V_{local}$ to the analog multiplication circuit 400. This permits each analog multiplication circuit 400A-D shown in FIG. 4 to locally determine the local voltage/capacitor charge for the product of its operands while connected to $V_{local}$ and connect to $V_{MAC}$ for charge sharing across the analog multiplication circuits 400A-D in VMAC for processing by the ADC 410.

The following table illustrates the positions for the first switches 520 and the second switch 540 in one embodiment of the MAC configuration shown in FIG. 4:

TABLE 2

| Step | S1 (Switch 520A-D) | S2 (Switch 540) |
|---|---|---|
| Discharge | GND | GND |
| Charge | First Operand | $V_{cc}$ |
| Average | Interconnect | $V_{local}$ |
| Discharge/"Multiply" | Second Operand | $V_{local}$ |
| Output | Interconnect | $V_{MAC}$ |

As shown in Table 2, similar to Table 1, the switches may initially be connected to a ground voltage to discharge existing charge and selectively charged according to the first operand. The second switch 540 may then be connected to $V_{local}$ such that the averaging is performed across the local capacitors, which are then selectively discharged or maintained to "multiply" the averaged charge based on the second operand. Each analog multiplication circuit 400 may then have a charge corresponding to the multiplication of its respective operands, which are then averaged across the analog multiplication circuits 400 by switching S2 to $V_{MAC}$. Similar to the discussion of analog multiplication circuit 100, a control circuit may control the execution of the steps shown above based on multiplexors, control signals, two-way switches, and/or other components.

Figure 6A:
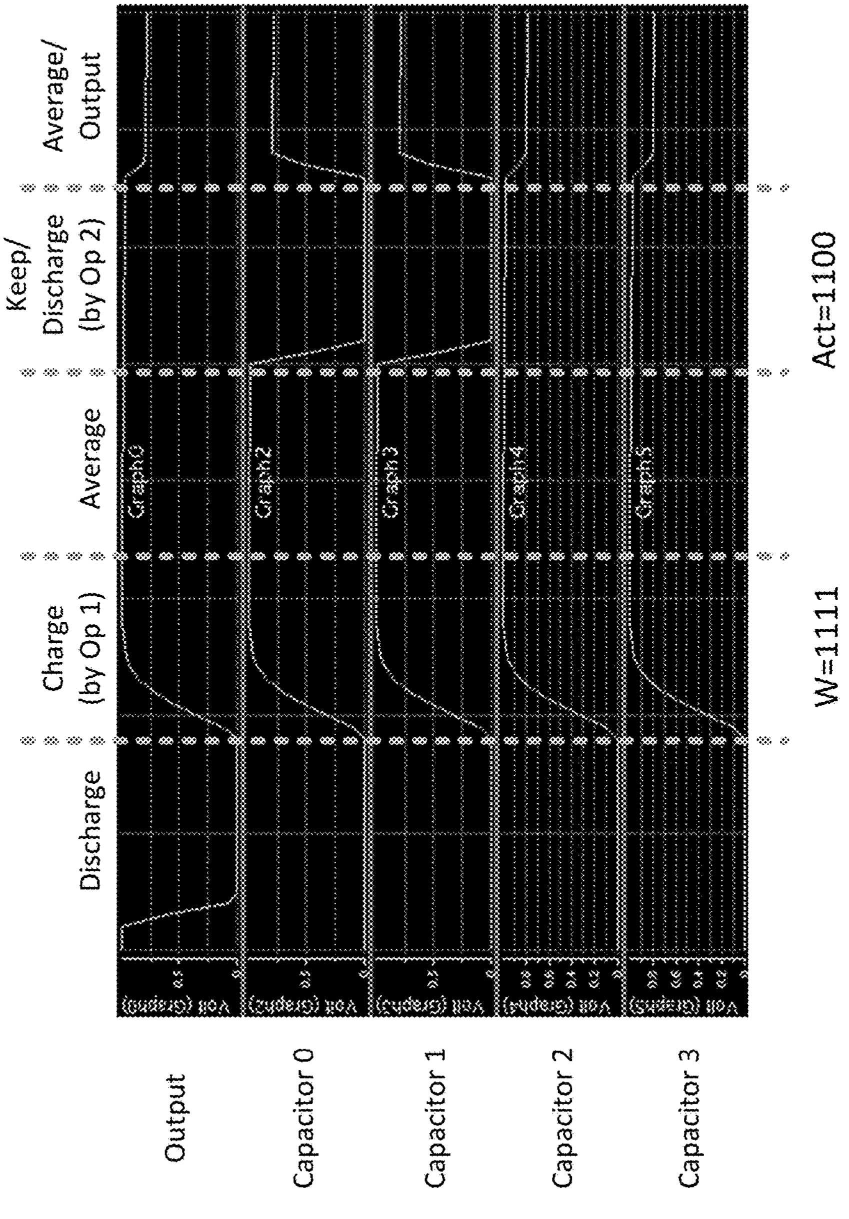
FIGS. 6A-C provide example simulation waveforms for multiplication operations using an analog multiplication circuit, according to one embodiment.
Figure 6B:
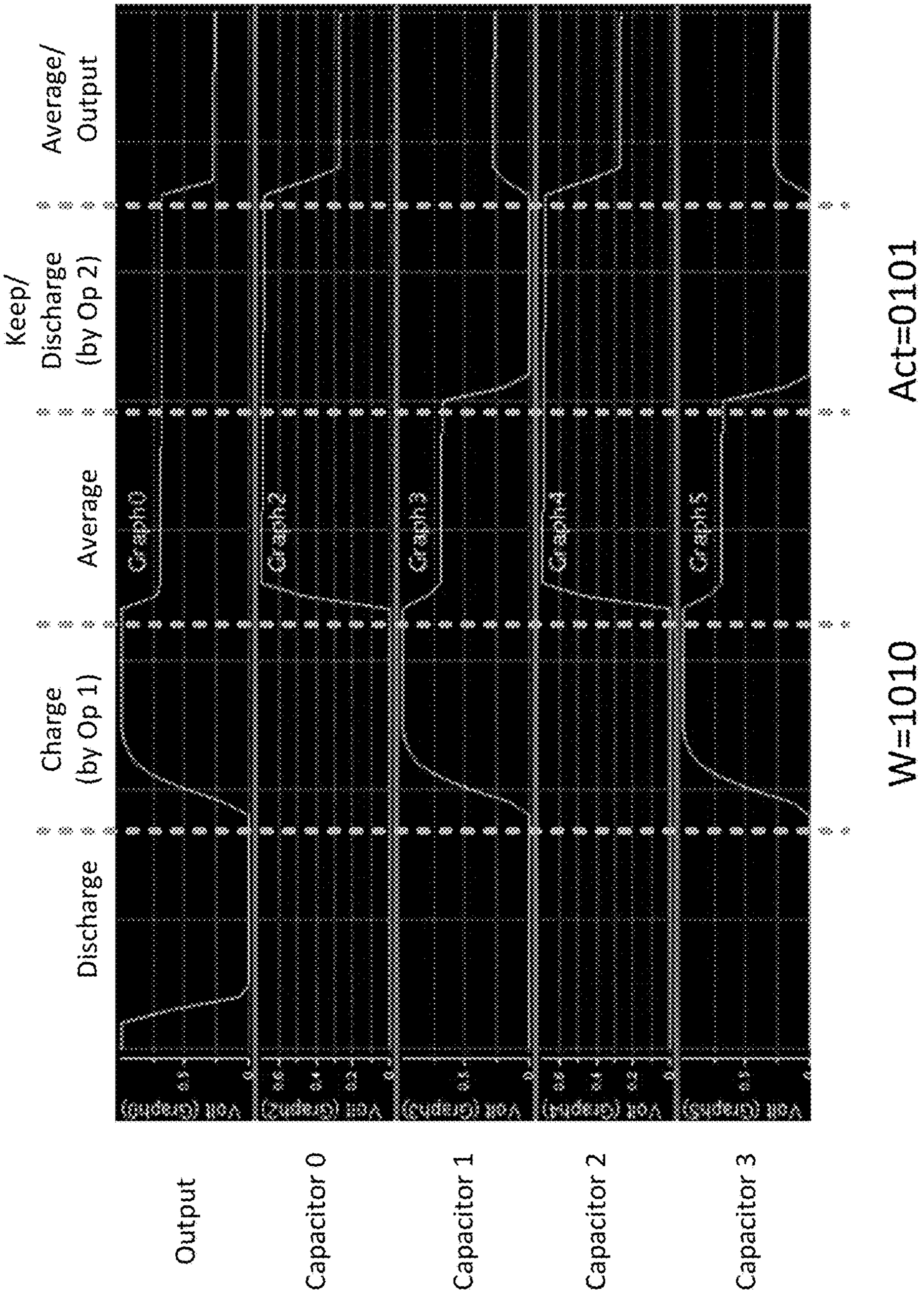
Figure 6C:
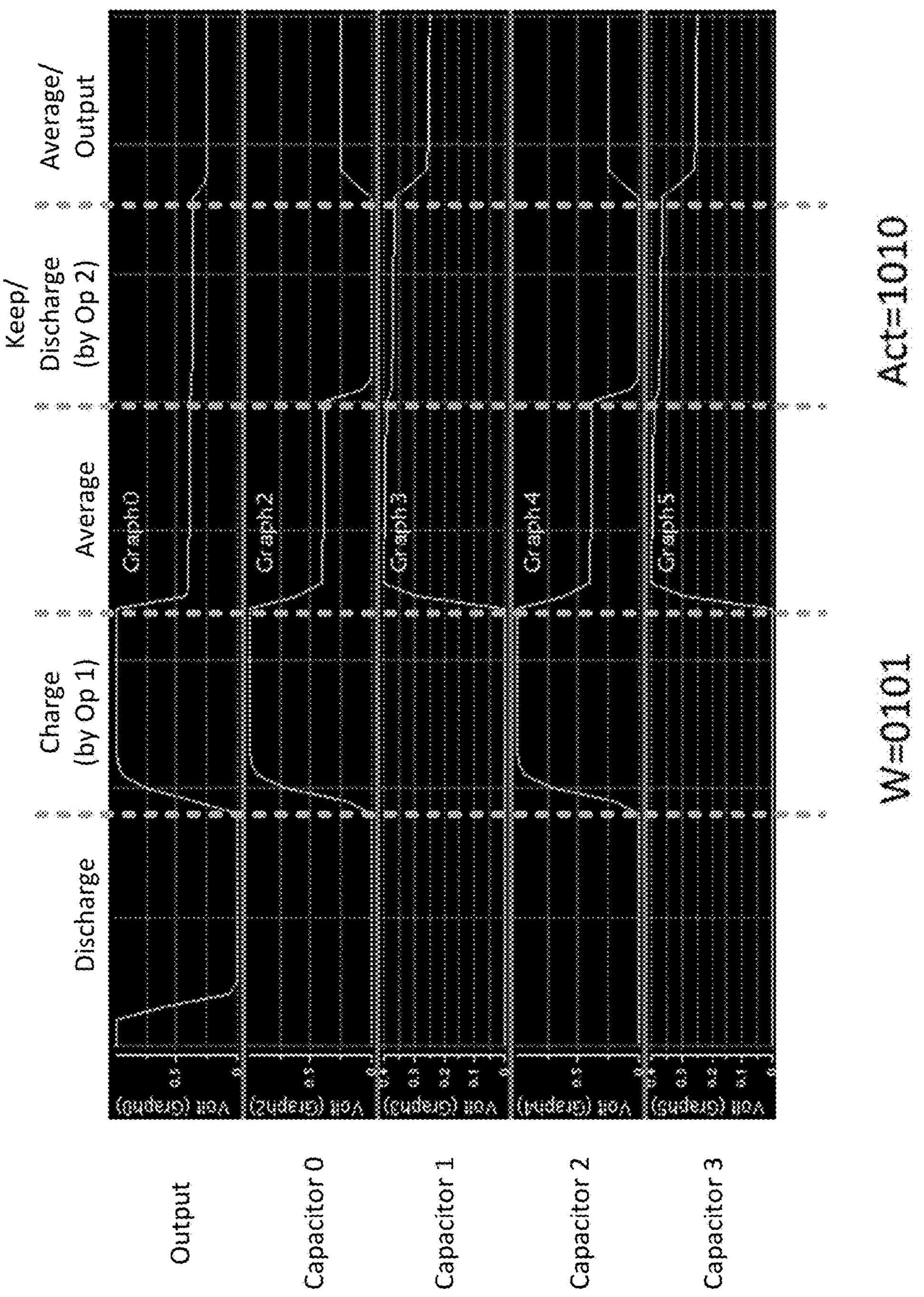

FIGS. 6A-C provide example simulation waveforms for multiplication operations using an analog multiplication circuit, according to one embodiment. In these examples, the output from each analog multiplication circuit yields the expected output with an error less than one least significant bit (LSB), which is 62.5 mV in a 4-bit operation at 1.0V of operational voltage (i.e., the charging voltage $V_{cc}$).

FIG. 6A illustrates a first operand (weight "W") having a value of 1111 and a second operand (activation "Act") having a value of 1100. As shown in this example, the first operand corresponds to all of the capacitors charged at the charging step, which, when averaged, maintains the same charge. The activation value of 1100 connects capacitors 0 and 1 to a ground voltage, draining the charge for capacitors 0 and 1 while leaving capacitors 2 and 3 charged. Finally, the values are averaged/output by connecting the capacitors to the common interconnect, sharing the charge and averaging the voltage, such that the charge on capacitor 2 and 3 is shared with capacitors 0 and 1. Since capacitors 0 and 1 have a lower capacitance relative to capacitors 2 and 3 (e.g., a unit capacitance of 1 & 2 relative to 4 & 8), the averaged output voltage reflects the comparatively high capacitance of charged capacitors 2 and 3.

FIG. 6B shows another example in which the first input has a value of 1010, such that capacitor 1 and capacitor 3 are charged during the charging step. After averaging, the charges are maintained/discharged according to the second operand 0101 and then averaged/output as discussed above. FIG. 6B shows that through the charge sharing, although the respective operands had no bit in common, the charge averaging/sharing permits all of the capacitors to reflect the value of the first operand, and the selective discharge enables the second operand to reflect a number of "copies" of the first operand to maintain to complete the multiplication.

Finally, FIG. 6C shows another example that switches the operands of the example in FIG. 6B, such that the first operand has a value of 0101 and the second operand has a value of 1010. Contrasted with FIG. 6B, FIG. 6C demonstrates that the circuit successfully generates the same output voltage irrespective of the order in which the same input operand values are processed.

Example Devices

Figure 7:
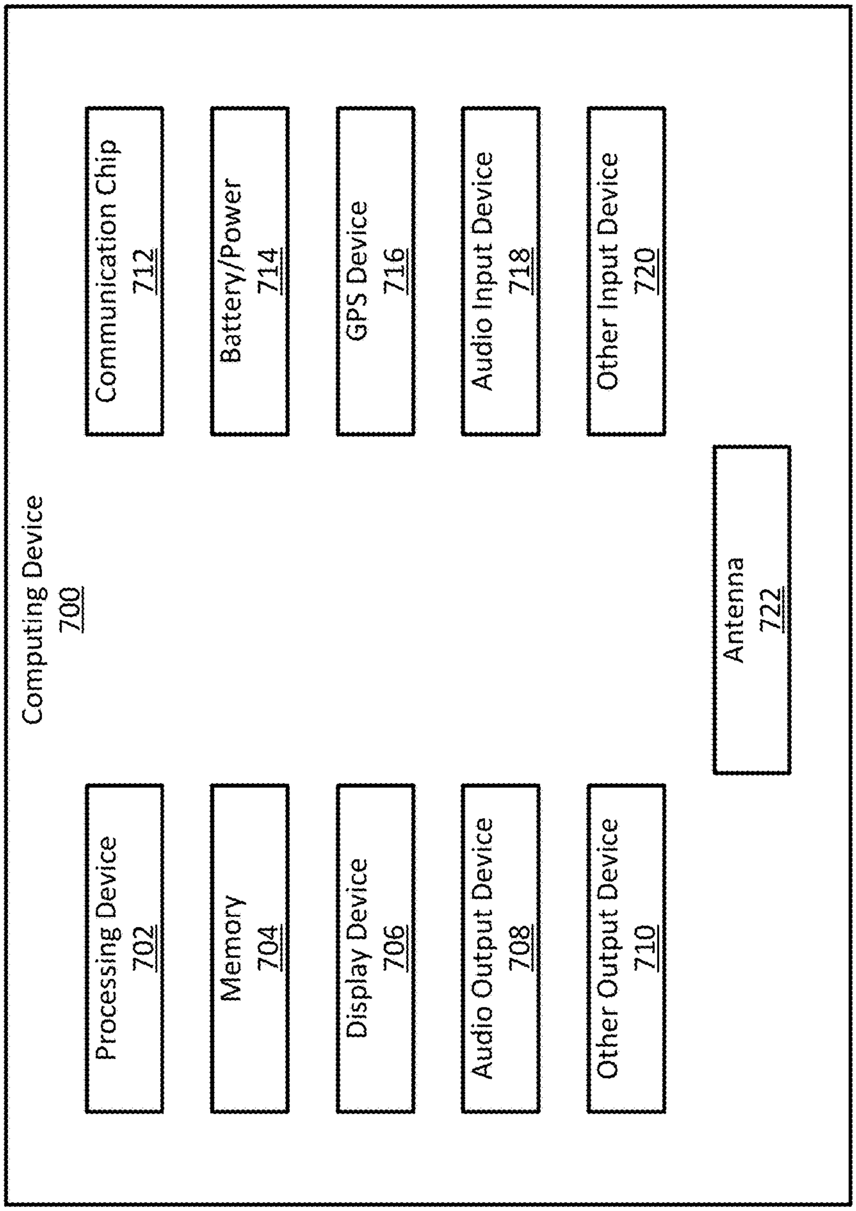
FIG. 7 is a block diagram of an example computing device that may include one or more components used for training, analyzing, or implementing a computer model in accordance with any of the embodiments disclosed herein.

FIG. 7 is a block diagram of an example computing device 700 that may include one or more components used for processing multiplication and/or VMM/MAC operations with hardware in accordance with any of the embodiments disclosed herein. For example, the computing device 700 may include a multiplication circuit or plurality of multiplication circuits that perform analog multiplication of one or more pairs of operands, and may include a memory that includes such computation circuit within the memory for executing functions of the computing device 700, and in some circumstances may include specialized hardware and/or software for VMM/MAC operations.

A number of components are illustrated in FIG. 7 as included in the computing device 700, but any one or more of these components may be omitted or duplicated, as suitable for the application. In some embodiments, some or all of the components included in the computing device 700 may be attached to one or more motherboards. In some embodiments, some or all of these components are fabricated onto a single system-on-a-chip (SoC) die.

Additionally, in various embodiments, the computing device 700 may not include one or more of the components illustrated in FIG. 7, but the computing device 700 may include interface circuitry for coupling to the one or more components. For example, the computing device 700 may not include a display device 706, but may include display device interface circuitry (e.g., a connector and driver circuitry) to which a display device 706 may be coupled. In another set of examples, the computing device 700 may not include an audio input device 718 or an audio output device 708 but may include audio input or output device interface circuitry (e.g., connectors and supporting circuitry) to which an audio input device 718 or audio output device 708 may be coupled.

The computing device 700 may include a processing device 702 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 702 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 700 may include a memory 704, which may itself include one or more memory devices such as volatile memory (e.g., dynamic random-access memory (DRAM)), nonvolatile memory (e.g., read-only memory (ROM)), flash memory, solid state memory, and/or a hard drive. The memory 704 may include instructions executable by the processing device for performing methods and functions as discussed herein. Such instructions may be instantiated in various types of memory, which may include non-volatile memory and as stored on one or more non-transitory mediums. In some embodiments, the memory 704 may include memory that shares a die with the processing device 702. This memory may be used as cache memory and may include embedded dynamic random-access memory (eDRAM) or spin transfer torque magnetic random-access memory (STT-MRAM).

In some embodiments, the computing device 700 may include a communication chip 712 (e.g., one or more communication chips). For example, the communication chip 712 may be configured for managing wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 712 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 712 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 712 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 712 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 712 may operate in accordance with other wireless protocols in other embodiments. The computing device 700 may include an antenna 722 to facilitate wireless communications and/or to receive other wireless communications (such as AM or FM radio transmissions).

In some embodiments, the communication chip 712 may manage wired communications, such as electrical, optical, or any other suitable communication protocols (e.g., the Ethernet). As noted above, the communication chip 712 may include multiple communication chips. For instance, a first communication chip 712 may be dedicated to shorter-range wireless communications such as Wi-Fi or Bluetooth, and a second communication chip 712 may be dedicated to longer-range wireless communications such as global positioning system (GPS), EDGE, GPRS, CDMA, WiMAX, LTE, EV-DO, or others. In some embodiments, a first communication chip 712 may be dedicated to wireless communications, and a second communication chip 712 may be dedicated to wired communications.

The computing device 700 may include battery/power circuitry 714. The battery/power circuitry 714 may include one or more energy storage devices (e.g., batteries or capacitors) and/or circuitry for coupling components of the computing device 700 to an energy source separate from the computing device 700 (e.g., AC line power).

The computing device 700 may include a display device 706 (or corresponding interface circuitry, as discussed above). The display device 706 may include any visual indicators, such as a heads-up display, a computer monitor, a projector, a touchscreen display, a liquid crystal display (LCD), a light-emitting diode display, or a flat panel display, for example.

The computing device 700 may include an audio output device 708 (or corresponding interface circuitry, as discussed above). The audio output device 708 may include any device that generates an audible indicator, such as speakers, headsets, or earbuds, for example.

The computing device 700 may include an audio input device 718 (or corresponding interface circuitry, as discussed above). The audio input device 718 may include any device that generates a signal representative of a sound, such as microphones, microphone arrays, or digital instruments (e.g., instruments having a musical instrument digital interface (MIDI) output).

The computing device 700 may include a GPS device 716 (or corresponding interface circuitry, as discussed above).

The GPS device 716 may be in communication with a satellite-based system and may receive a location of the computing device 700, as known in the art.

The computing device 700 may include an other output device 710 (or corresponding interface circuitry, as discussed above). Examples of the other output device 710 may include an audio codec, a video codec, a printer, a wired or wireless transmitter for providing information to other devices, or an additional storage device.

The computing device 700 may include an other input device 720 (or corresponding interface circuitry, as discussed above). Examples of the other input device 720 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 700 may have any desired form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 700 may be any other electronic device that processes data.

Select Examples

The following paragraphs provide various examples of the embodiments disclosed herein.

Example 1 provides a circuit including a plurality of capacitors, each capacitor having a capacitance corresponding to a bit value of a logical bit in a plurality of logical bits; a plurality of first switches, each first switch coupled to a corresponding capacitor and configured to connect the corresponding capacitor to a common interconnect or to a ground voltage based at least in part on a first operand or a second operand; a second switch configured to selectively connect the common interconnect to a voltage source; and an analog-to-digital converter configured to read a voltage of the common interconnect and generate a digital output.

Example 2 provides the circuit of example 1, further including a control circuit configured to: selectively charge the plurality of capacitors by switching the plurality of first switches to the common interconnect according to the first operand and switching the second switch to the voltage source; after charging the plurality of capacitors, switching the second switch away from the voltage source and connecting the plurality of first switches to the common interconnect; selectively reducing the charge of the plurality of capacitors by switching the plurality of first switches to the common interconnect or the ground voltage according to the second operand; and after selectively reducing the charge, switching the plurality of first switches to the common interconnect.

Example 3 provides the circuit of example 2, wherein the control circuit is further configured to, before selectively charging the plurality of capacitors, discharge the capacitors by switching the plurality of first switches to the ground voltage.

Example 4 provides the circuit of any of examples 1-3, wherein the second switch is further configured to selectively connect the common interconnect to the ground voltage.

Example 5 provides the circuit of any of examples 1-4, wherein the first or second logical operand comprise binary logical bits.

Example 6 provides the circuit of any of examples 1-5, wherein the circuit is in a memory array.

Example 7 provides the circuit of example 6, wherein the digital output is stored to a location in the memory array.

Example 8 provides the circuit of example 6, wherein the first operand or the second operand is stored in the memory array.

Example 9 provides the circuit of any of examples 1-8, wherein the first operand or the second operand is a weight value.

Example 10 provides the circuit of any of examples 1-9, wherein the first operand or the second operand is an activation value.

Example 11 provides the circuit of any of examples 1-10, wherein the common interconnect is further connected to a second plurality of capacitors, and the voltage level is an accumulation of a first multiplication represented by a first charge of the plurality of capacitors and a second multiplication represented by a second charge of the second plurality of capacitors.

Example 12 provides a method comprising selectively charging a plurality of capacitors, each capacitor having a capacitance corresponding to a bit value of a logical bit in a plurality of logical bits, by switching a plurality of first switches, each first switch coupled with to a respective capacitor of the plurality of capacitors, to a common interconnect or a ground voltage according to a first operand and switching a second switch coupled to the common interconnect to a voltage source; after charging the plurality of capacitors, switching the second switch away from the voltage source and connecting the plurality of first switches to the common interconnect to average the charge across the plurality of capacitors; selectively reducing the charge of the plurality of capacitors by switching the plurality of first switches to the common interconnect or the ground voltage according to a second operand; after selectively reducing the charge, switching the plurality of first switches to the common interconnect; and outputting a digital output based on a voltage level of the common interconnect.

Example 13 provides the method for example 12, further comprising, before selectively charging the plurality of capacitors, discharging the capacitors by switching the plurality of first switches to the ground voltage.

Example 14 provides the method of any of examples 12-13, wherein the second switch is further configured to selectively connect the common interconnect to the ground voltage.

Example 15 provides the method of any of examples 12-14, wherein the first or second logical operand comprise binary logical bits.

Example 16 provides the method of any of examples 12-15, wherein the plurality of capacitors is in a memory array.

Example 17 provides the method of example 16, wherein the digital multiplication output is stored to a location in the memory array.

Example 18 provides the method of example 16, wherein the first operand or the second operand is stored in the memory array.

Example 19 provides the method of any of examples 12-18, wherein the first operand or the second operand is a weight value.

Example 20 provides the method of any of examples 12-19, wherein the first operand or the second operand is an activation value.

Example 21 provides the method of any of examples 12-20, wherein the common interconnect is further connected to a second plurality of capacitors, and the voltage level is an accumulation of a first multiplication represented by a first charge of the plurality of capacitors and a second multiplication represented by a second charge of the second plurality of capacitors.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

What is claimed is:

1. A circuit for multiply-and-accumulate operations, comprising:

a plurality of analog multiplication circuits to generate a voltage representing a sum of activation-weight products of a neural network operation, an analog multiplication circuit comprising:

a plurality of capacitors, each capacitor having a capacitance corresponding to a bit value of a logical bit in a plurality of logical bits, a plurality of first switches, each first switch coupled to a corresponding capacitor and configured to connect the corresponding capacitor to a common interconnect or to a ground voltage based at least in part on a first operand or a second operand, and a second switch configured to selectively connect the common interconnect to a voltage source and to selectively connect the common interconnect to the ground voltage; and an analog-to-digital converter coupled with the plurality of analog multiplication circuits, the analog-to-digital converter configured to receive the voltage from the plurality of analog multiplication circuits and to generate a digital output from the voltage.

2. The circuit of claim 1, further comprising a control circuit configured to:

selectively charge the plurality of capacitors by switching the plurality of first switches to the common interconnect according to the first operand and switching the second switch to the voltage source;

after charging the plurality of capacitors, switching the second switch away from the voltage source and connecting the plurality of first switches to the common interconnect;

selectively reducing the charge of the plurality of capacitors by switching the plurality of first switches to the common interconnect or the ground voltage according to the second operand; and after selectively reducing the charge, switching the plurality of first switches to the common interconnect.

3. The circuit of claim 2, wherein the control circuit is further configured to, before selectively charging the plurality of capacitors, discharge the capacitors by switching the plurality of first switches to the ground voltage.

4. The circuit of claim 1, wherein the first or second logical operand comprise binary logical bits.

5. The circuit of claim 1, wherein the circuit is in a memory array.

6. The circuit of claim 5, wherein the digital output is stored to a location in the memory array.

7. The circuit of claim 5, wherein the first operand or the second operand is stored in the memory array.

8. The circuit of claim 1, wherein the first operand or the second operand is a weight value or an activation value for a convolutional layer.

9. The circuit of claim 1, wherein the common interconnect is further connected to a second plurality of capacitors, and the voltage is an accumulation of at least a first multiplication represented by a first charge of the plurality of capacitors and a second multiplication represented by a second charge of the second plurality of capacitors.

10. A method for executing a multiply-and-accumulate operation, the method comprising:

generating, by a plurality of analog multiplication circuits, a voltage representing a sum of activation-weight products of a neural network operation, wherein generating the voltage comprises:

selectively charging a plurality of capacitors in an analog multiplication circuit, each capacitor having a capacitance corresponding to a bit value of a logical bit in a plurality of logical bits, by switching a plurality of first switches in the analog multiplication circuit, each first switch coupled to a respective capacitor of the plurality of capacitors, to a common interconnect or a ground voltage according to a first operand and switching a second switch in the analog multiplication circuit, the second switch coupled to the common interconnect to a voltage source, after charging the plurality of capacitors, switching the second switch away from the voltage source and connecting the plurality of first switches to the common interconnect to average the charge across the plurality of capacitors, selectively reducing the charge of the plurality of capacitors by switching the plurality of first switches to the common interconnect or the ground voltage according to a second operand, and after selectively reducing the charge, switching the plurality of first switches to the common interconnect;

receiving, by an analog-to-digital converter coupled with the plurality of analog multiplication circuits, the voltage from the plurality of analog multiplication circuits; and generating, by the analog-to-digital converter a digital output from the voltage.

11. The method of claim 10, further comprising, before selectively charging the plurality of capacitors, discharging the capacitors by switching the plurality of first switches to the ground voltage.

12. The method of claim 10, wherein the second switch is further configured to selectively connect the common interconnect to the ground voltage.

13. The method of claim 10, wherein the first or second operand comprise binary logical bits.

14. The method of claim 10, wherein the plurality of capacitors is in a memory array.

15. The method of claim 14, wherein the digital output is stored to a location in the memory array.

16. The method of claim 14 wherein the first operand or the second operand is stored in the memory array.

17. The method of claim 10, wherein the first operand or the second operand is a weight value or an activation value for a convolutional layer.

18. The method of claim 10, wherein the common interconnect is further connected to a second plurality of capacitors, and the voltage is an accumulation of a first multiplication represented by a first charge of the plurality of capacitors and a second multiplication represented by a second charge of the second plurality of capacitors.

19. The circuit of claim 1, wherein the second switch is to be disconnected from an output of the analog multiplication circuit to the analog-to-digital converter for the analog multiplication circuit to determine a local voltage, wherein the voltage is generated based on the local voltage.

20. The circuit of claim 1, wherein the second switch is to be connected to an output of the analog multiplication circuit to the analog-to-digital converter for charge sharing across at least some of the plurality of analog multiplication circuits.

* * * * *